US010847948B2

(12) United States Patent
Khan et al.

(10) Patent No.: US 10,847,948 B2

(45) Date of Patent: Nov. 24, 2020

(54) SELF-INJECTION LOCKED TUNABLE LASER

(71) Applicant: King Fahd University of Petroleum and Minerals, Dhahran (SA)

(72) Inventors: Mohammed Zahed Mustafa Khan, Dhahran (SA); Md. Hosne Mobarok Shamim, Dhahran (SA); Tien Khee Ng, Dhahran (SA); Boon S. Ooi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 16/352,300

(22) Filed: Mar. 13, 2019

(65) Prior Publication Data

US 2020/0295536 A1 Sep. 17, 2020

(51) Int. Cl.

*H01S 5/065* (2006.01)
*H01S 5/068* (2006.01)
*H01S 5/042* (2006.01)
*H01S 3/11* (2006.01)
*H01S 5/30* (2006.01)
*H01S 3/105* (2006.01)
*H01S 5/14* (2006.01)

(52) U.S. Cl.

CPC ............ *H01S 5/0657* (2013.01); *H01S 3/105* (2013.01); *H01S 3/1109* (2013.01); *H01S 5/042* (2013.01); *H01S 5/068* (2013.01); *H01S 5/14* (2013.01); *H01S 5/3013* (2013.01)

(58) Field of Classification Search

CPC ...... H01S 5/0657; H01S 3/1109; H01S 5/042; H01S 5/14; H01S 3/105; H01S 5/068; H01S 5/3013

See application file for complete search history.

(56) References Cited

U.S. PATENT DOCUMENTS 4,446,557 A 5/1984 Figueroa
5,097,476 A * 3/1992 Thiessen .................. G01D 5/26 372/20
5,499,261 A 3/1996 Welch et al.
5,594,543 A * 1/1997 de Groot .............. G01S 7/4811 356/28.5
5,684,623 A 11/1997 King et al.

(Continued)

OTHER PUBLICATIONS

Shamim, et al. ; Tunable self-injection locked green laser diode ; Optics Letters vol. 43, No. 20 ; pp. 4931-4934 ; Oct. 15, 2018 ; 4 Pages.

(Continued)

*Primary Examiner* — Yuanda Zhang

(74) *Attorney, Agent, or Firm* — Oblon, McClelland, Maier & Neustadt, L.L.P.

(57) ABSTRACT

A system and methods are drawn to a self-injection locked tunable laser using an InGaN/GaN gain chip to produce precise laser output at visible wavelengths. An external cavity length is adjusted by motorized stage to tune a resonance frequency of the external cavity to match the resonance frequency of the laser and self-injection lock the mode of the wavelength. Fine tuning is provided by adjusting the tilt angle of the partially reflective mirror. The laser diode may be operated at a range of injection currents and temperatures and provides precise control of output laser wavelengths and linewidths.

14 Claims, 11 Drawing Sheets

(56) References Cited

U.S. PATENT DOCUMENTS

| | | | | |
|---|---|---|---|---|
| 6,026,100 | A * | 2/2000 | Maeda | H01S 5/141 372/102 |
| 6,222,860 | B1 * | 4/2001 | Pittaro | G01N 21/39 372/19 |
| 6,556,599 | B1 * | 4/2003 | Svilans | H01S 5/141 372/20 |
| 2002/0172238 | A1 | 11/2002 | Thoma et al. | |
| 2004/0165639 | A1 * | 8/2004 | Lang | H01S 5/141 372/92 |
| 2006/0092996 | A1 * | 5/2006 | Nguyen | H01S 5/141 372/20 |
| 2006/0193354 | A1 | 8/2006 | Rosenblatt | |
| 2007/0008996 | A1 * | 1/2007 | Linville | H01S 3/08036 372/32 |
| 2015/0070774 | A1 * | 3/2015 | Kadoya | G02B 26/002 359/634 |
| 2017/0229842 | A1 * | 8/2017 | Hatori | H01S 5/0652 |

OTHER PUBLICATIONS

Sala, et al. ; Free-carrier screening of polarization fields in wurtzite GaN/InGaN laser structures ; Sep. 9, 1998 ; 4 Pages.

Chi, et al. ; Green high-power tunable external-cavity GaN diode laser at 515 nm ; Optics Letters vol. 41, No. 18 ; Sep. 15, 2016 ; 4 Pages.

Thorlabs ; L520P50—520 nm, 50 mW, 5.6 mm, A Pin Code, Laser Diode ; Product ; 1 Page.

Thorlabs ; A110TM-A—f=6.24, NA=0.40, Mounted Rochester Aspheric Lens, AR: 250—700 nm ; Product ; 1 Page.

EO Edmund Optics Worldwide ; Polka-Dot Beamsplitters ; Product ; 3 Pages.

Hong ; Design and Characterization of a Littrow Configuration External Cavity Diode Laser ; 9 Pages.

* cited by examiner

SELF-INJECTION LOCKED TUNABLE LASER

STATEMENT OF PRIOR DISCLOSURE BY INVENTORS

Aspects of this technology are described in an article by the inventors "Tunable self-injection locked green laser diode", published in Optics Letters, 2018, Vol. 43, No. 20, 4931-4934 on Oct. 15, 2018, which is incorporated herein by reference in its entirety.

BACKGROUND

Technical Field

The present disclosure is directed to a self-injection locked tunable laser using an InGaN/GaN gain chip to produce precise laser output at visible wavelengths. An external cavity length is adjustable by motorized stage. An adjustable tiltable mirror on the motorized stage provides further tunability of the resonance frequency of the laser and self-injection locking of the mode of the wavelength.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Tunable lasers in the visible region are used in various technologies, such as bio-imaging, display technology, spectroscopy, meteorology sensors, etc. External-cavity semiconductor lasers, including lasers with frequency selective tuning elements in the cavity, such as a grating structure, are well known and have been extensively studied. However, a tunable laser is complex and difficult to implement commercially.

An optical feedback external cavity diode laser (ECDL) system having a passively locked tunable and high-intensity laser which contains three reflectors is known. An external reflector forms an external cavity and the other two reflectors are the facets of the laser diode. The wavelength of the laser diode can be adjusted by tuning the external cavity length, by using a frequency limiting device, such as a Bragg reflector. Further tuning of the external cavity can be done by changing the temperature, which simultaneously changes the refractive index of the laser diode thus shifting the wavelength (see U.S. Pat. No. 5,684,623, incorporated herein by reference in its entirety). This tunable laser requires a very high reflectivity of the third reflector which must be greater (reflectivity 90-99%) than the reflectivity of the laser facets, which limits the potential usage of this device.

Bragg and diffraction gratings have been used to obtain optical feedback (see U.S. Pat. Nos. 6,470,036B1, 8,218,586B2, 5,594,744A, and 6,192,059B1, each incorporated herein by reference in their entirety).

The broad emission spectrum and smaller tuning window of InGaN/GaN based laser diodes limits various potential applications in the visible spectrum. Wavelength tuning with a narrow linewidth in the visible region is essential in applications such as wavelength division multiplexing (WDM), spectroscopy, holographic displays, Sr+ ion trapping for Sr+ atomic clock, and other bio-photonic applications. Distributed feedback (DFB) or distributed Bragg reflector (DBR) lasers are available as tunable lasers; however, this technology is not well known in the visible wavelengths.

Further, monolithic approaches to semiconductor tunable lasers involving phased amplifier gain sections in a single cavity have been studied comprehensively, however, these result in lower outputs (see L. A. Coldren, "Monolithic tunable diode lasers," *IEEE J. Sel. Top. Quantum Electron.*, vol. 6, no. 6, pp. 988-999, 2000, incorporated herein by reference in its entirety).

Heating as a tuning parameter in multi-section DFB lasers have been researched, but yield a smaller tuning bandwidth in C band (see M. Larson et al., "Narrow linewidth high power thermally tuned sampled-grating distributed Bragg reflector laser," in *Optical Fiber Communication Conference/National Fiber Optic Engineers Conference* 2013, 2013, p. OTh3I.4, incorporated herein by reference in its entirety).

External cavity diode lasers (ECDL) are known which achieve tunability with narrower linewidths in near infrared and visible wavelengths. ECDL systems using a Littrow configuration is known (see M. Chi, O. B. Jensen, and P. M. Petersen, "Green high-power tunable external-cavity GaN diode laser at 515 nm," Opt. Lett., vol. 41, no. 18, p. 4154, 2016; Y. H. Chen, W. C. Lin, H. Z. Chen, J. T. Shy, and H. C. *Chui*, "Single-Frequency External Cavity Green Diode Laser," *IEEE Photonics J.*, vol. 9, no. 6, 2017; M. Chi, O. B. Jensen, and P. M. Petersen, "Tuning range and output power optimization of an external-cavity GaN diode laser at 455 nm," *Appl. Opt.*, vol. 55, no. 9, p. 2263, 2016; N. Ruhnke et al., "400 mW external cavity diode laser with narrowband emission at 445 nm.," *Opt. Lett.*, vol. 39, no. 13, pp. 3794-7, 2014; T. Laurila, T. Joutsenoja, R. Hernberg, and M. Kuittinen, "Tunable external-cavity diode laser at 650 nm based on a transmission diffraction grating.," *Appl. Opt.*, vol. 41, no. 27, pp. 5632-5637, 2002; D. J. Lonsdale, A. P. Willis, and T. A. King, "Extended tuning and single-mode operation of anti-reflection-coated InGaN violet laser diode in a Littrow cavity,"*Meas. Sci. Technol.*, vol. 13, no. 4, pp. 488-493, 2002; L. Hildebrandt, R. Knispel, S. Stry, J. R. Sacher, and F. Schael, "Antireflection-coated blue GaN laser diodes in an external cavity and Doppler-free indium absorption spectroscopy,"*Appl. Opt.*, vol. 42, no. 12, p. 2110, 2003; and J. Hult, I. S. Burns, and C. F. Kaminski, "Wide-bandwidth mode-hop-free tuning of extended-cavity GaN diode lasers," *Appl. Opt.*, vol. 44, no. 18, p. 3675, 2005, each incorporated herein by reference in their entirety). The grating structure is an essential part of the above systems for frequency/wavelength selection and this wavelength light beam is diffracted into different orders, wherein the zeroth order beam is used as the output and the first order as the feedback.

In a Littrow configuration there is only one controlling parameter, the angle of the diffraction grating. If the angle varies, the output beam misaligns (see C. J. Hawthorn, K. P. Weber, and R. E. Scholten, "Littrow configuration tunable external cavity diode laser with fixed direction output beam," *Rev. Sci. Instrum.*, vol. 72, no. 12, pp. 4477-4479, 2001, incorporated herein by reference in its entirety). Further, large power losses due to the lower grating efficiency for higher tunability were found to be problematic (see O. J. Hong, Wenxian and Painter, "Design and Characterization of a Littrow configuration external cavity diode laser," 2005, incorporated herein by reference in its entirety). The Littman-Metcalf configuration solves the misalignment problem by the addition of an extra mirror but makes the system more complex. For both methods, the operating injection current is usually kept near to the threshold current to ensure single longitudinal mode (SLM) operation while shifting the wavelengths, which limits the full exploitation of the laser diode capacity. Hence, a cost-effective and easy to implement tunable laser system is needed.

A need exists for a new type of external cavity diode laser, which overcomes the disadvantages of currently available devices, and which provides a combination of faster tuning, better stability and simpler control. Self-injection locking is introduced in the present disclosure as an alternative to the Littrow/Littman-Metcalf configuration to achieve wideband tunability with narrow linewidths.

In an embodiment of the present disclosure, a partially reflective mirror is used at a distance from the laser diode facet, thus forming an external cavity, which reflects a portion of the emitted light beam back to the laser internal cavity and reflects the remaining part as the output beam.

There are three degrees of freedom for tuning the external cavity length, which determines the wavelength of the laser diode. When the frequency of the laser diode matches the frequency of the external cavity, resonance occurs, the laser locks to the resonance wavelength. External cavity length, injection current, and temperature are the tuning parameters in the tunable laser of the present disclosure. Moreover, single longitudinal mode operation with an extremely narrow linewidths may also be achieved, thus the tunable diode laser of the present disclosure is an attractive alternative to the AlGaN/InGaN DFB laser or distributed Bragg reflector (DBR) lasers which are not yet well known on InGaN/GaN gain chips.

The self-injection locked tunable laser of the present disclosure provides a simpler, cheaper, and flexible alternative to the existing technologies. The external cavity self-injection locking scheme which is used to lock a specific single longitudinal mode at the desired wavelength ensures the discrete wavelength tunability. Such a simple and compact tunable laser system, especially in the visible region, should have high demand in multi-disciplinary applications.

The present disclosure presents a self-injection locked tunable laser using InGaN/GaN gain chips in visible wavelengths, which overcomes the problems of tunable lasers in conventional systems. While the Littrow or Littman/Metcalf configuration requires micro-optics and gratings with complex alignment, the self-injection locked tunable laser system of the present disclosure significantly simplifies the design for external cavity diode-based tunable lasers. Precise control of the external cavity lengths is accomplished by a motorized translational stage. The tunable laser system can be integrated on a single platform making it compact and user-friendly.

SUMMARY

In an exemplary embodiment, a self-injection locked tunable laser system comprises a semiconductor laser diode, preferably a GaN/InGaN laser diode, a collimating lens and a partially reflecting mirror arranged coaxially on an optical axis. The partially reflecting mirror may be mounted on a motorized translational stage, which is configured to move along the optical axis toward or away from the laser diode. The tilt angle of the partially reflecting mirror may be adjusted manually or by adjustable motors. The distance between a front facet of the laser diode and the front of the partially reflecting motor defines an external cavity.

The self-injection locked tunable laser system may be operated by injecting current into the laser diode. A light beam is generated by the current. The light beam is reflected from partially reflective surfaces in the internal cavity of the laser diode until a first resonance condition is reached. The light beam is then emitted from the internal cavity through the front facet and the rear facet. The light beam impinges on the partially reflecting mirror and is reflected back to the laser diode. The light beam is reflected back and forth between the front facet of the laser diode and the partially reflecting mirror. The distance between the laser diode and the partially reflecting mirror and the tilt angle of the partially reflecting mirror are adjusted until a second resonance frequency within the external cavity is reached. A small portion of the beam reenters the front facet and tunes the first resonance frequency to match the second resonance frequency, thus self-injection locking the mode of the laser beam. The laser beam is output through the partially reflecting mirror or the rear facet of the laser diode.

In another exemplary embodiment, a method for using self-injection locked tunable laser comprises injecting a current into a semiconductor laser diode and increasing the amplitude until a first resonance condition is reached and the laser diode emits a laser beam at a first resonant frequency having a plurality of modes. The method includes powering a motorized stage holding a partially reflecting motor, coaxially located with respect to the laser diode, to move along a distance, d, to adjust the length of the external cavity formed by the front of the laser diode and the partially reflecting mirror. The method further includes collimating the laser beam by using a collimating lens placed proximate to the emitting surface of the laser diode. Adjusting the length of the external cavity and the tilt angle of the partially reflecting mirror causes the laser beam to resonate at a second resonance frequency within the external cavity. A portion of the laser beam at the second resonance frequency entering the laser diode and interacting with the first resonance frequency. The method includes adjusting the injection current, the temperature, the tilt angle and the distance until the first resonance frequency matches the second resonance frequency, thus self-injection locking the mode of the output laser beam.

In another exemplary embodiment, the system and method include the addition of a second stage having a second partially reflecting mirror, second collimating lens, second translational stage and second adjustable tilting motors. The second stage receives the laser beam output from the first partially reflecting motor and the distance between the first partially reflecting mirror and the second partially reflecting mirror is adjusted until a third resonance condition is reached which matches the second resonance frequency. The stage acts as a fine tuning of the second resonance frequency. The self-injection locked laser beam is then output through the second partially reflecting mirror or from the rear facet of the laser diode, to be used as needed.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
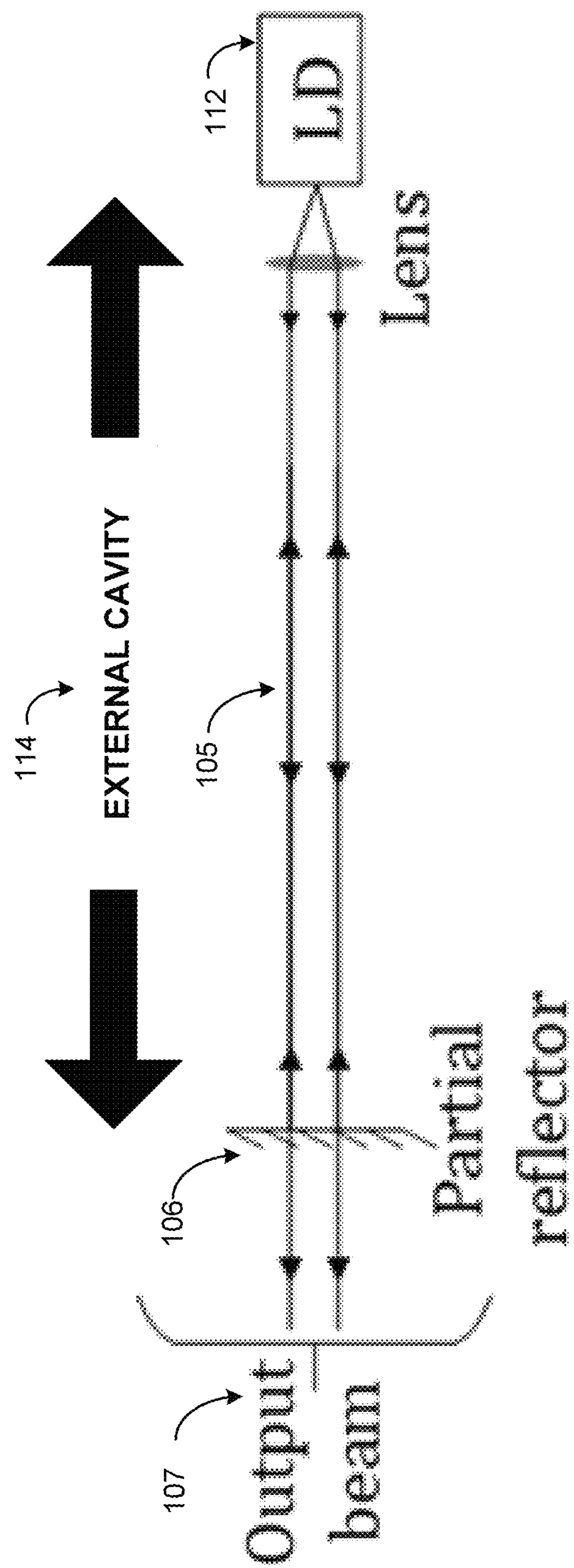
FIG. 1A illustrates the exterior cavity of the laser system.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Some definitions used throughout the present disclosure follow.

The term "mode" refers to the harmonics of a fundamental resonant frequency, i.e., the frequency of a wave where a double cavity length matches the wavelength, thus forming a "standing wave" in the cavity. As the frequency increases, each time the double cavity length matches an integer number of wavelengths, a standing wave is generated. The first mode is called the fundamental mode, and each additional mode is referred to as a harmonic.

An active laser medium (also called gain medium or lasing medium) is the source of optical gain within a laser. The gain results from the stimulated emission of electronic or molecular transitions to a lower energy state from a higher energy state previously populated by a pump source. The gain medium increases the power of the output laser beam.

Aspects of this disclosure are directed to a self-injection locked tunable laser system, and methods for using a self-injection locked tunable laser.

The self-injection locked tunable laser system of the present invention provides a laser beam output in the visible light range (about 600 nm) from a GaN/InGaN laser diode. An external cavity system is used with the laser diode. Laser beam feedback within the external cavity sets up a secondary resonance frequency. Some of the laser beam at the second resonance frequency reenters the internal cavity of the laser diode to interact with the first resonance frequency. The cavity length and angle of incidence of the laser beam feedback is adjusted until the first and second resonance frequencies match. This matching locks the longitudinal mode (harmonic) of the frequency of the laser beam, thus selecting the wavelength of the laser beam.

The external cavity consists of the front surface of the laser diode, a collimating lens and a partially reflecting mirror.

Preferably there is no wavelength selecting device within the external cavity. A wavelength selecting device may be a wavelength tunable filter, a Bragg grating structure, a diffraction grating structure, a wavelength modifier, or any other type of wavelength selector.

The reflectivity of the partial mirror should be chosen to reflect a portion of the light beam back to the laser facet. There is no minimum limit to the reflectivity of the external reflector, however, 10% reflectivity is sufficient to lock the laser diode. In a non-limiting example, 30% of the light beam may be fed back into the external cavity and 70% may pass through the mirror as the laser beam output.

Preferably, the collimating lens is an aspheric lens of short focal length, in the range of 3-12 mm, preferably 5-10 mm, even more preferably 5-7 mm.

In a non-limiting example, the GaN/InGaN laser diode may be a green GaN/InGaN laser diode, exhibiting 50 mW optical power at a maximum 160 mA continuous-wave injection current such as the L520P50, which is manufactured by Thorlabs, mounted on a Thorlabs TCLDM9 laser diode mount (see Thorlabs Inc., Newton, N.J., United States, Newton, N.J., United States, https://www.thorlabs.com/thorproduct.cfm?partnumber=L520P50). The GaN/InGaN laser diode was investigated by the instant inventors (see Shamim, H., Ng, Tien, Ooi, B., Khan, M., "*Tunable self-injection locked green laser diode*", Optics Letters, 15 Oct. 2018, Vol. 43, No. 20, pp. 4031-4034, incorporated herein by reference in its entirety).

In a non-limiting example, the aspheric lens of short focal length may be the A110TM-A of a focal length of 6.24 mm and numerical aperture 0.40, such as is manufactured by Thorlabs. (See: Thorlabs, Inc., Newton, N.J., United States, https://www.thorlabs.com/thorproduct.cfm?partnumber=A110TM-A).

The partially reflecting mirror acts as a beam splitter which reflects a portion of the laser beam back into the external cavity and allows the remaining laser beam to pass through the mirror as an output laser beam. In a non-limiting example, a polka-dot beamsplitter 2103 manufactured by Edmund Optics may be used as the partially reflecting mirror (see Edmund Optics, 101 East Gloucester Pike, Barrington, N.J. 08007 USA, https://www.edmundoptics.com/f/polka-dot-beamsplitters/12506/).

A single axis motorized translational stage includes a mount for holding the partially reflecting mirror. In a non-limiting example, the single axis motorized translational stage and mount may be of the types manufactured by Thorlabs, In a non-limiting example, the mount for the partially reflecting mirror may be the KM100 mirror mount having two adjusting knobs for adjusting the tilt angle of the partially reflecting mirror, sold by Thorlabs (see Thorlabs, Inc., Newton, N.J., United States, https://www.thorlabs.com/search/thorsearch.cfm?search=KM100). The combination of single axis motorized stage and adjusting knobs gives three degrees of freedom in adjusting the mirror. Optionally, the knobs may be motorized, for fine control of the tilt angle.

The tunability of the feedback is accomplished by controlling the external cavity length and feedback angle to achieve a round-trip phase match of any particular longitudinal mode, whose wavelength (frequency) resonates within the composite cavity (i.e., laser and external cavity). This ensures self-injection locking of that particular mode, and all the power from the neighboring side modes consolidate in increasing this dominant mode power while being suppressed, thus significantly improving the side mode suppression ratio. Although tunability is possible at any injection current within the laser diode rating, the tuning window of injection currents in the present disclosure are selected as between low (36 mA) and high (160 mA).

The side mode suppression ratio may be set at a threshold of 10 dB for best system performance. The side mode suppression ratio threshold may be preferably set in the range of 1-50 dB, more preferably set in the range of 10-40 dB, even more preferably set in the range of 10-30 dB, even more preferably set in the range of 10-20 dB.

Figure 2:
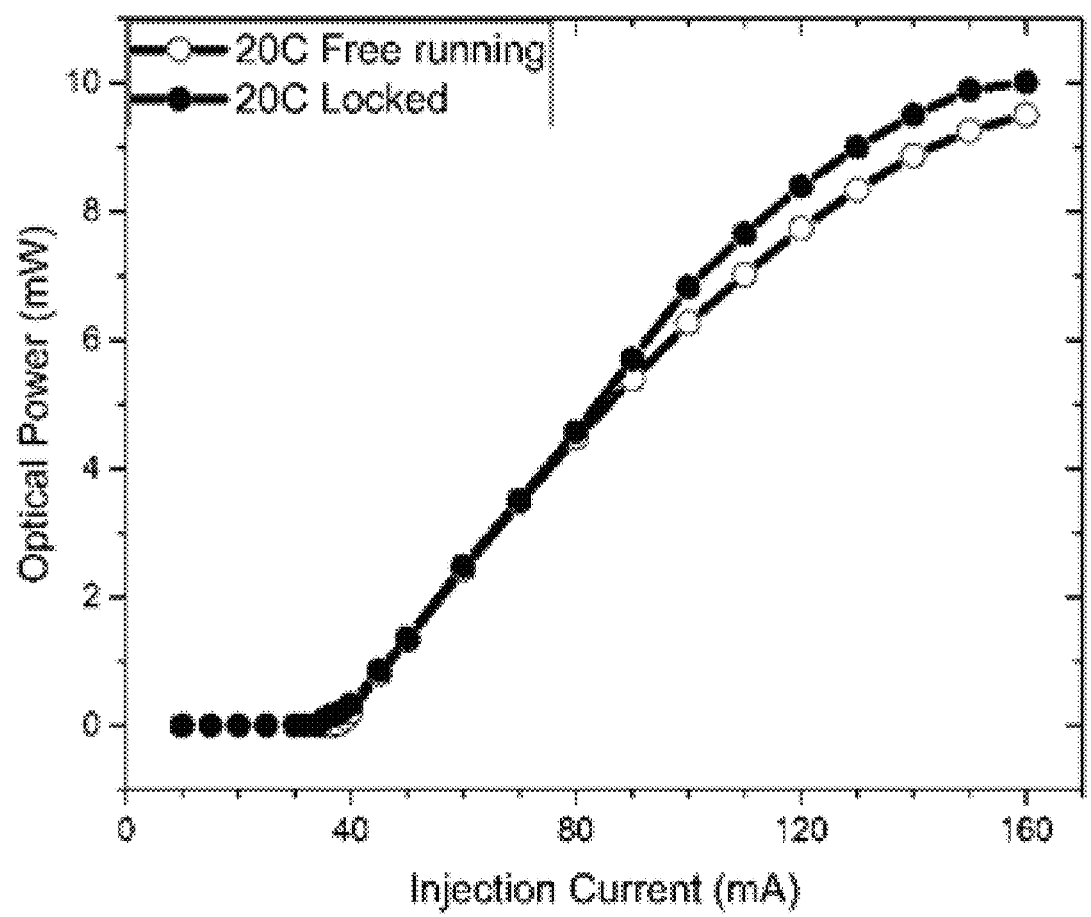
FIG. 2 illustrates L-I characteristics of self-injection locked tunable laser system at 20° C. compared to the free-running characteristics.
Figure 3:
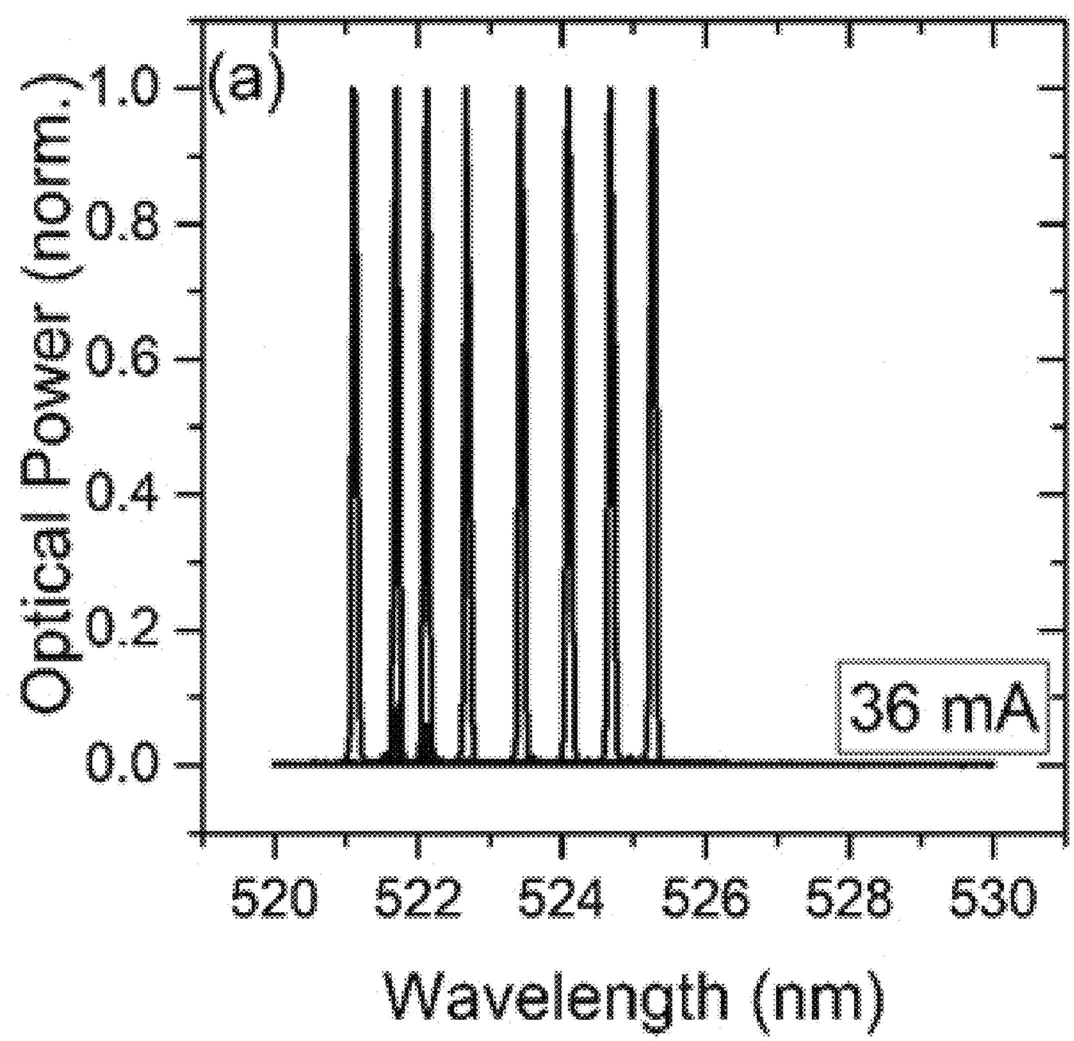
FIG. 3 is a graph illustrating the superimposed lasing spectra demonstrating the tunability of a green laser diode at 20° C., and at low injection current of 36 mA.

In a self-injection locked tunable laser using visible light semiconductor laser diodes 112, a collimating lens and a partially reflective mirror 106 (reflectivity 10-100%), it is necessary to form a free space external cavity 114 (refer to FIG. 1A). To obtain wideband tunability, the length of the external cavity 114 is tuned. When the resonance frequency of the external cavity matches the resonance frequency of the internal cavity of the laser diode, the laser is said to "lock" frequencies. This resonance frequency dominates over other longitudinal modes adjacent to it. The output beam is collected at the other end 107 of the partial mirror or from the rear facet 103 of the laser diode which can be used in various applications. The laser diode 112, partial mirror 106, and the output beams 107 are on the same optical axis which negates the possibilities of misalignment due to change in temperature or injection current. Moreover, in the self-injection locking scheme, the laser diode turns on at a lower threshold current than for a laser diode without self-injection locking, which ensures higher output power at the same injection current, as shown in FIG. 2. This higher output power compensates for the power loss due to optical feedback at the partial reflector. An aspheric lens 104 of short focal length is used in the present disclosure to collimate the light beams (see FIG. 1B). Some part of the light beam goes through the partial mirror 106, and some goes into the laser active region 101 (see FIG. 1C, showing the laser diode having a first partial reflector 102, a second partial reflector 103 and an internal cavity 101 which holds a gain medium (not shown)). When a particular mode of the frequency coincides with the frequency of the laser external 114 and internal cavity 101 with laser diode gain medium, or in another way, if the round-trip phase of a particular mode from the optical feedback beam is phase matched in the composite cavity, that mode locks. Thus, by controlling the external cavity length at different injection currents, tunability of a single locked mode is achieved, where the linewidth is well below 100 pm, as shown in FIG. 3, 4.

In an aspect of the present disclosure, the entire reflected beam is directed as feedback into the laser diode having a front and back surface due to the adjustability of the partially reflective mirror. Changing the phase of a particular mode from all the wavelength modes of the reflected beam (via a slight change $\Delta d$ in the external cavity length via linear and/or tilt angle movement of the partial mirror) to cause self-injection locking, locks the mode which is sustained in the system cavity. This mode then builds up, modifying the wavelength thus achieving wavelength tuning.

Figure 1B:
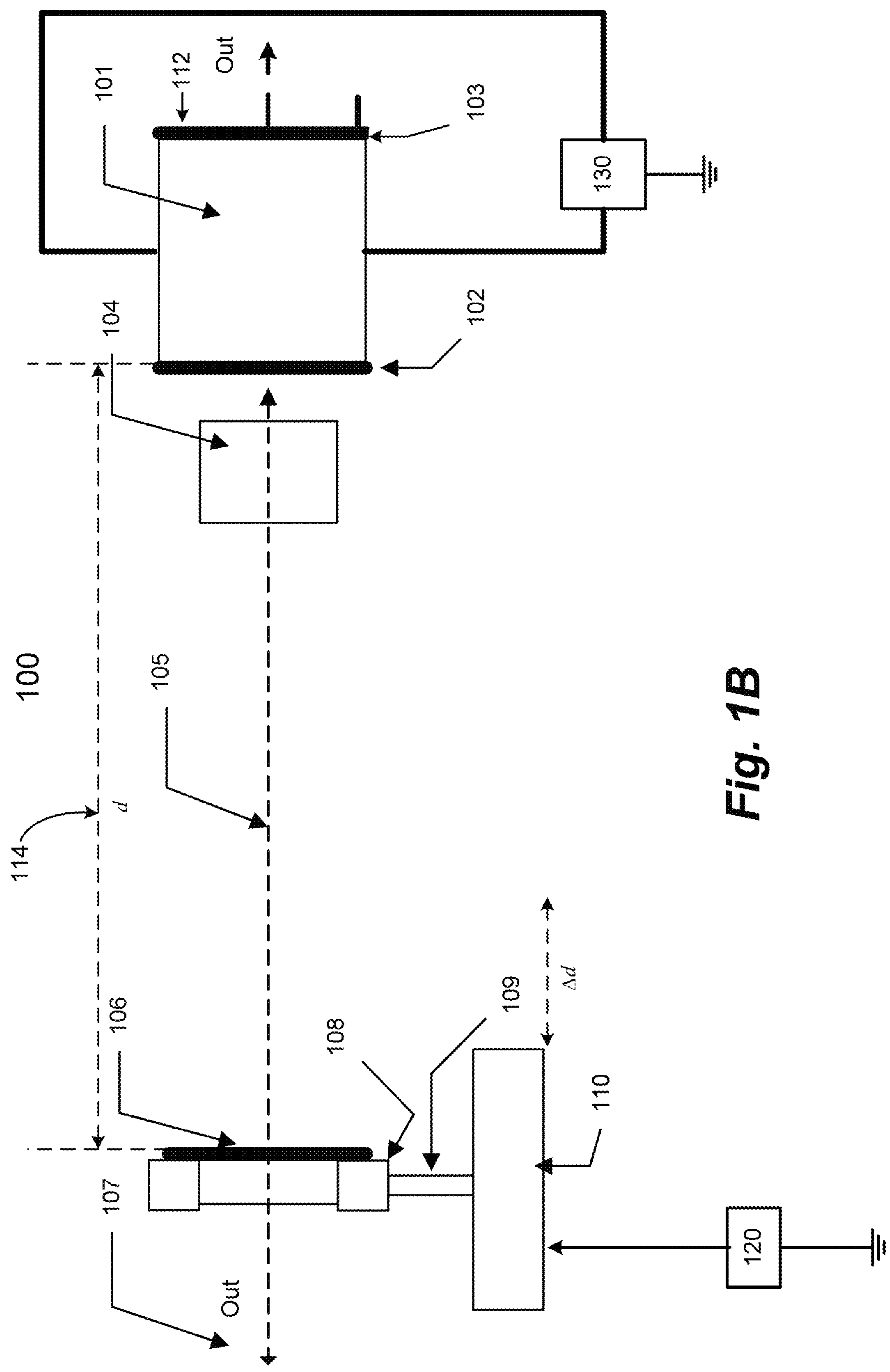
FIG. 1B illustrates the external cavity of the system including the placement of the elements of the system, according to the exemplary embodiments.
Figure 1C:
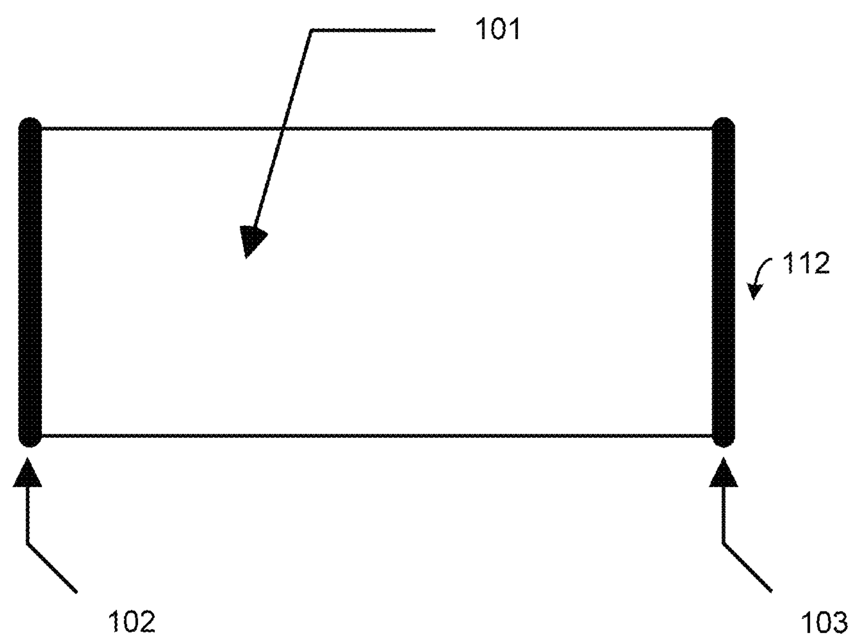
FIG. 1C illustrates the interior cavity of the laser diode.

An overview of the system is illustrated in FIG. 1B.

The laser diode internal cavity with gain medium is shown as 101. The lens to collimate and focus the laser beam is shown as 104. The optical path of the system shows the placement of the laser diode 112, lens 104 and partially reflecting mirror 106, which are coaxially located on the optical path 105. The output light beam 107 is shown as exiting from the other side of the partial reflector.

The tilting mount 108 is able to slightly tilt the partial reflector 106. The stand 109 holds the partial reflector 106 and tilting mount 108. The linear translational stage 110 is able to change the distance between 106 and 102 that forms the external cavity length 114 along the optical path 105. Adjusters of the tilting mount may optionally be motorized for fine control of the angle of the partially reflective mirror.

The first embodiment is described with respect to FIG. 1A, 1B, 1C and FIG. 5. A self-injection locked tunable laser system 100, comprises an optical axis 105; a semiconductor laser diode 112 located on the optical axis, the semiconductor laser diode having an internal cavity 101 formed by a partially reflective first surface 102 and a second partially reflective opposing surface 103, the internal cavity further including a laser gain medium (not shown).

The system further includes a first collimating lens 104 on the optical axis and proximate the first surface 102; a first partially reflecting mirror 106 on the optical axis 105; a first motorized translational stage 110 located at a distance, d, from the first surface. The collimating lens is an aspheric lens of short focal length in the range of 3-12 mm, preferably 5-10 mm, even more preferably 5-7 mm.

A first tilting mount 108 is located on the first motorized translational stage 110 and is configured to support the first partially reflecting mirror, wherein the first tilting mount further includes first adjusters for tilting the first partially reflecting mirror. The adjusters are optionally motorized (not shown).

First circuitry 130 is configured to inject current into the semiconductor laser diode, wherein injecting current into the semiconductor laser diode causes light to resonate at a first frequency within the internal cavity and to emit a laser beam from the first surface 102 and the second surface 103, the laser beam having a plurality of wavelength modes. The negative contact is grounded.

Second circuitry 120 is configured to power the first motorized translational stage to move along the distance, d, and/or to adjust the angle of the first tilting mount 108.

The semiconductor laser diode, the first collimating lens and the first partially reflecting mirror are coaxially located with respect to the optical axis 105. The first partially reflecting mirror 106, the first collimating lens 104 and the first surface 102 form a first external laser cavity 114, the first partially reflecting mirror reflecting a first portion of the laser beam along optical path 105 towards the front surface 102. The first external cavity 114 does not include a wavelength selective tuning element, such as a wavelength tunable filter, a Bragg grating structure, a diffraction grating structure, a wavelength modifier, or a wavelength selector.

The first motorized translational stage 110 is powered by the second circuitry 120 to move the first mirror along the optical axis to change the length by an amount Δd of the first external laser cavity, and the first tilting mount 108 is configured for changing the angle α of the reflection of a portion of the laser beam by an amount Δα, thus causing a second portion of the laser beam to pass through the first tilting mirror as a first output laser beam 107.

The system is configured such that adjusting the distance, d, and the angle of reflection a of the first portion of the laser beam causes the first portion of the laser beam to enter the front surface and tune the mode of the resonant frequency of the laser beam in the internal cavity.

The laser diode is preferably a GaN/InGaN laser diode.

The laser beam in the first external cavity 105 resonates at a second frequency within the first external cavity based on the distance, d; and wherein changing the distance, d, by an amount Δd tunes the second resonance frequency to match the first resonance frequency, thus causing the laser beam to self-injection lock to a particular wavelength mode. Self-injection locking to a particular wavelength mode substantially increases a peak power and a total power of the particular mode as compared to the other wavelength modes. The self-injection ratio, defined as the ratio of the power of the laser beam from the first external cavity entering the front surface of the laser diode to the power of the laser beam exiting the front surface of the laser diode from the internal cavity, may be in the range of −20 dB to −1 dB, preferably −15 dB to −1 dB, more preferably −12 dB to −1 dB.

Figure 4:
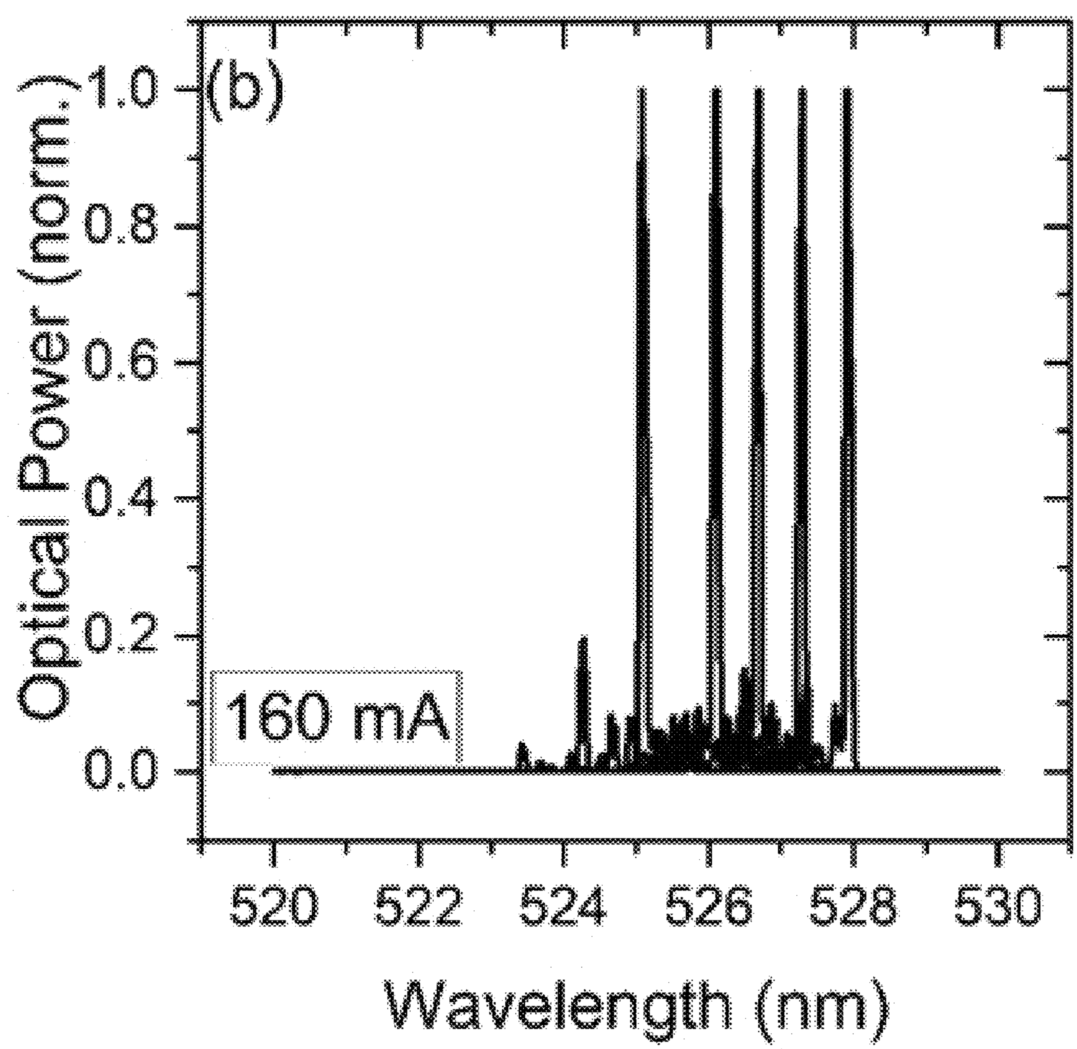
FIG. 4 is a graph illustrating the superimposed lasing spectra demonstrating the tunability of green laser diode at 20° C., and at high injection current of 160 mA.

The laser diode operates at a temperature in the range of 0° C. to 50° C., and an injection current in the range of 35 mA to 160 mA. The tunability increases with temperature but decreases with injection current. The laser diode is preferably operated in the range of 20° C. to 40° C. for injection currents in the range of 35 mA to 160 mA, more preferably at 20° C. for injection currents in the range of 80 mA to 160 mA and at 40° C. for injection currents in the range of 35 mA to less than 80 mA. Further, the self-injection wavelength mode has a linewidth of 60 pm to 100 pm, for all operating injection currents in the range of 35 mA to 160 mA and temperatures in the range of 0° C. to 50° C. In a non-limiting example of using the system with a green GaN/InGaN laser diode, the linewidth is 59.1 pm at 40° C. and is 68.1 pm at 20° C. In the operating range of 0° C. to 50° C., the linewidth is 71.1 pm. FIG. 3 illustrates the wavelength of a green GaN/InGaN laser diode at an injection current of 36 mA. As can be seen in FIG. 3, the optical power is high for wavelengths between 521 and 526 nm. FIG. 4 illustrates the output power at wavelengths in the range of 524-528 nm.

The laser diode has a threshold injection current for producing a laser beam. The threshold injection current of the laser diode with self-injection locking is less than the threshold current of the laser diode without self-injection locking at a particular temperature.

Figure 5:
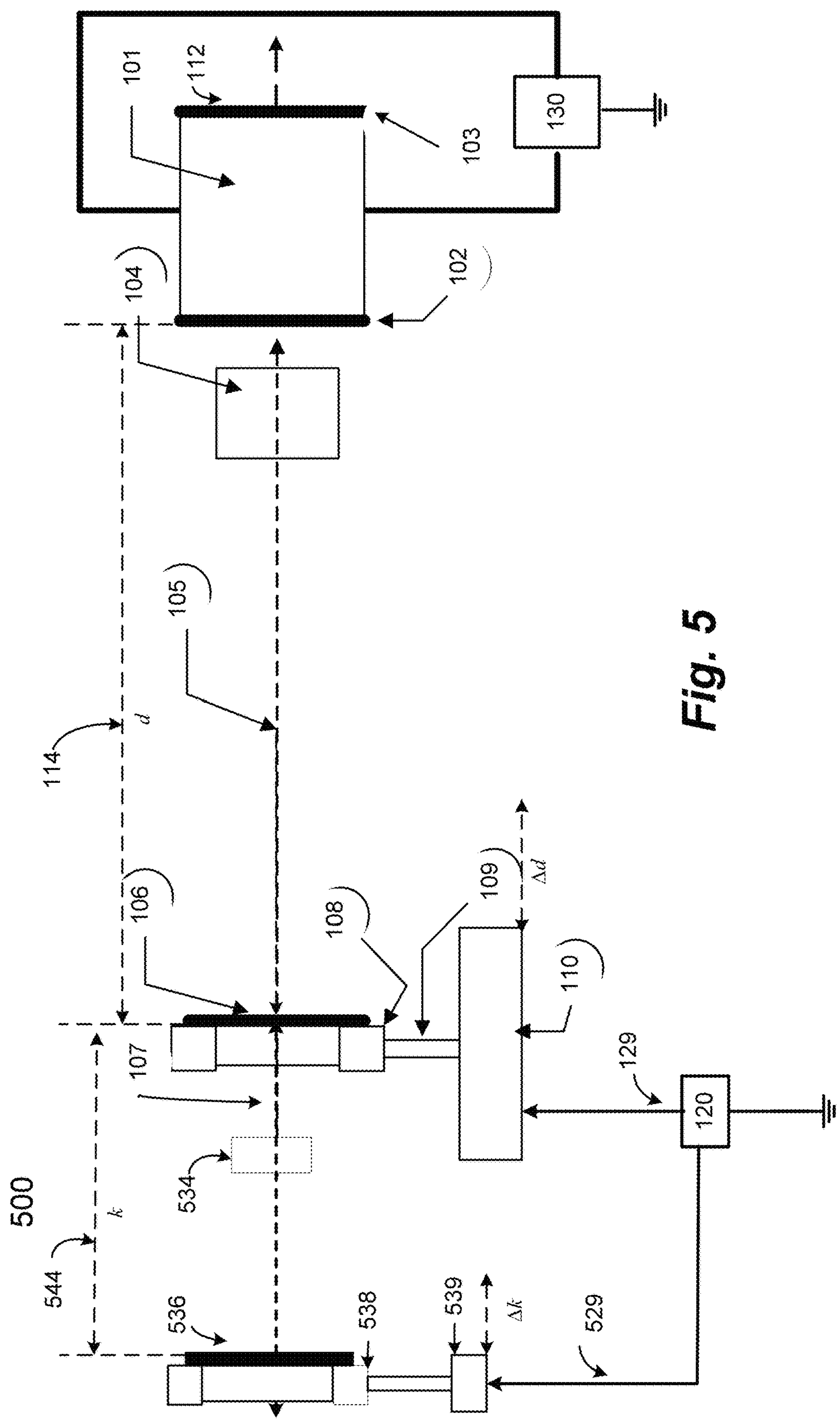
FIG. 5 illustrates a two stage system, according to certain embodiments.

The system may be a two stage or multi-stage system as shown in FIG. 5. A two stage system 500 comprises a second partially reflecting mirror 536 on the optical axis and coaxial with the first partially reflecting mirror 106, such that a second external cavity 544 is formed between the first partially reflecting mirror 106 and the second partially reflecting mirror 536;

A second motorized translational stage 539 is located a distance, k, from the first partially reflecting mirror, a second tilting mount 538 located on the second motorized translational stage and configured to support the second partially reflecting mirror 536, wherein the second tilting mount further includes second adjusters (not shown) to tilt the partially reflecting mirror.

Fourth circuitry 529 is configured to power the second motorized translational stage to move along the distance, k, as well as the angle of the tilting mount 538. The second portion of the laser beam 107 output from the first external cavity 114 is reflected from the second partially reflecting mirror 536 and resonates in the second external cavity 544 at a third frequency based on the distance, k.

The second motorized translational stage is powered to change the distance, k, by an incremental distance Δk. Further, the second adjusters are moved to adjust the angle of reflection of the laser beam in the second cavity to tune the mode of the resonance frequency of the laser beam in the second cavity to equal the mode of the resonance frequency of the laser beam in the first cavity, thus self-injection locking the laser beam in the second cavity to the laser beam in the first cavity. The self-injection wavelength mode using the two stage system has a linewidth of less than 60 pm for all operating injection currents in the range of 35 mA to 160 mA and temperatures in the range of 0° C. to 50° C.

The second embodiment to a method for self-injection locking a tunable laser is described with respect to FIGS. 1A-1C, 5. The method comprises arranging a semiconductor laser diode 112, first collimating lens 104 and first partially reflecting mirror 106 coaxially with respect to an optical axis 105, wherein the semiconductor laser diode has an internal cavity and a first facet, and wherein the distance, d, between the front facet of the laser diode and the mirror defines a first external cavity 114, injecting, by a current source 130, current into the semiconductor laser diode, wherein when the current is greater than a lasing threshold current of the laser diode, until the laser beam resonates at a first resonance frequency within the internal cavity, causing the laser diode to emit a laser beam through the front facet. The method continues by collimating, by the first collimating lens, the laser beam emitted from the front facet, by using an aspheric lens of short focal length, and reflecting, by the first partially reflecting mirror 108, a first portion of the laser beam back towards the front facet 102.

Tuning is accomplished by adjusting the distance between the first partially reflecting mirror and the front facet by a first motorized translational stage 110 having a first tilting mount 108 for holding the first partially reflecting mirror 106, adjusting, by first adjusters on the first tilting mount, the angle of reflection of the first partially reflecting mirror, wherein adjusting the distance, d, and the angle of reflection of the first portion of the laser beam causes the first portion of the reflected laser beam to reenter the front facet and tune the first resonant frequency of the laser beam in the internal cavity to self-injection lock the first resonance frequency. The output of the laser beam is ensured by transmitting, by the first partially reflecting mirror, a second portion of the laser beam as an output laser beam 107.

The method comprises using a GaN/InGaN laser diode as the semiconductor laser diode.

The laser beam in the first external cavity 114 resonates at a second frequency within the first external based on the distance, d; and wherein changing the distance, d, tunes the second resonance frequency to match the first resonance frequency, thus causing self-injection locking of the laser beam to a particular wavelength mode.

The method continues by operating the laser diode at a temperature in the range of 0° C. to 50° C. and an injection current in the range of 35 mA to 160 mA, and tuning the first resonance frequency in the internal cavity by adjusting the injection current and/or the temperature.

In operating, the laser diode emits, from the front facet, a laser beam having a plurality of modes of the first resonance frequency; which is tuned by adjusting the distance between the first partially reflecting mirror and the front facet until the laser beam resonates within the first external cavity at a second resonance frequency equal to the first resonance frequency to self-injection lock to a single mode of the plurality of modes.

The method comprises a two-stage or multi-stage configuration as shown in FIG. 5. The method includes arranging a second partially reflecting mirror 536 on the optical axis 105 and coaxial with the first partially reflecting mirror 106, such that a second external cavity 544 is formed between the first partially reflecting mirror and the second partially reflecting mirror, arranging a second collimating lens 534 in the second external cavity coaxial with the first partially reflecting mirror and the second partially reflecting mirror; arranging a second motorized translational stage 539 at a distance, k, from the first partially reflecting mirror; installing a second tilting mount 538 on the second motorized translational stage and installing the second partially reflecting mirror on the second tilting mount, the second tilting mount further including second adjusters for tilting the partially reflecting mirror.

The method further includes powering, by fourth circuitry 529, the second motorized translational stage to move along the distance, k; reflecting, from the second partially reflecting mirror, the laser beam output from the first external cavity; powering the second motorized translational stage to continue to change the distance, k, until the laser beam resonates in the second external cavity at a third frequency. Tuning is accomplished by adjusting the second adjusters to adjust the angle of reflection of the laser beam in the second cavity to tune the third resonance frequency to equal the frequency of the laser beam in the first external cavity, thus self-injection locking the mode of the laser beam in the second external cavity to the mode of the laser beam in the external first cavity.

FIGS. 1A-1C, 5 illustrate a third embodiment to a method for self-injection locking the tunable laser, which comprises injecting, by a current source, current into a semiconductor laser diode 112 until the laser diode emits a laser beam at a resonance frequency having a plurality of modes; collimating, using an aspheric lens with short focal length, the laser beam; reflecting, from a partially reflecting mirror 106, a portion of the laser beam back into laser diode; adjusting the distance between the partially reflecting mirror and the laser diode and a tilt angle of the partially reflecting mirror until the laser beam self-injection locks the mode of the resonance frequency of the laser beam; outputting the laser beam by passing the laser beam through the partially reflecting mirror. The method comprises using a GaN/InGaN laser diode as the semiconductor laser diode.

Figure 6:
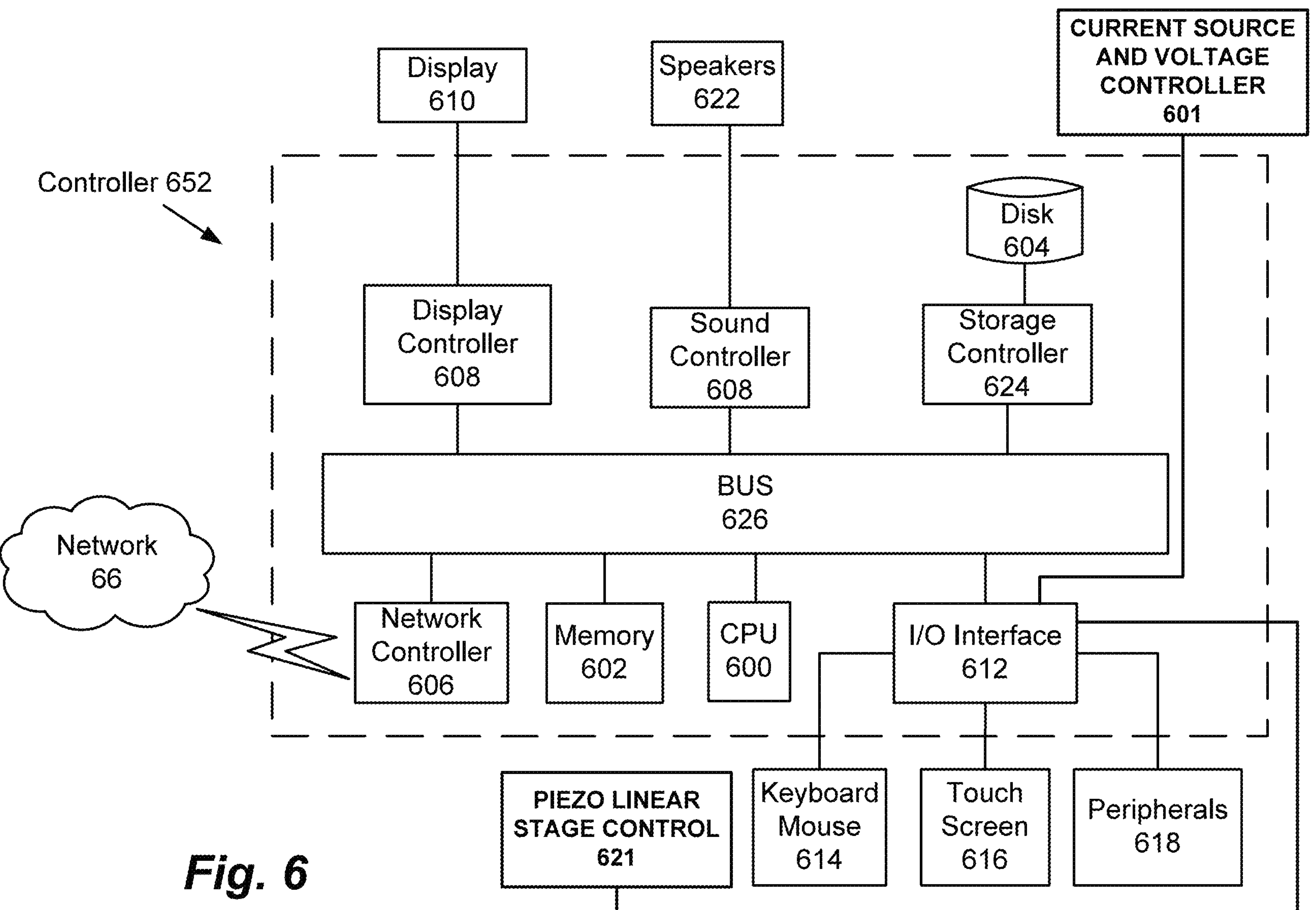
FIG. 6 is an illustration of a non-limiting example of a controller, according to certain embodiments.

Conventional controllers 120 and 130 can be used to provide power to the laser diode and to the translational stages 108 and 538. A controller such as may be used for controller 120 or 130 is shown in FIG. 6. The controller 120 may receive input from piezo linear stage controller 621. Controller 130 is connected to a current source and voltage controller 601 to adjust the voltage and current inputs to the laser diode 112.

The self-injection tunable laser diode system is described in an example below using a green InGaN/GaN semiconductor laser diode. However, the system is not limited to a green InGaN/GaN laser diode, but may be used with any color semiconductor laser diode available in the visible wavelengths, particularly in the 400-600 nm region.

The configuration is based on a partially reflective mirror and a green InGaN/GaN commercial laser diode, thus making the system simple and cost-effective. Because of the partial nature of the reflector, from which the usable output light beam exits, a small part of this light beam is optically fed back into the laser active region for locking purposes, thus ensuring fixed direction and robust operation. By controlling the distance between the laser diode and the mirror, which forms an external cavity, successful locking of various longitudinal modes is accomplished. The system is discretely tunable up to 7.11 nm in the green color region, and even at high injection currents. Through optimization of controlling parameters, spectral linewidths up to 69 pm and a side mode suppression ratio (SMSR) of 28 dB are measured with high optical powers. This self-injection locked-based tunable laser system, uses no grating structure or any additional mirrors, unlike conventional structures. Moreover, this robust system is also implementable under any bias current and temperature within the laser diode specifications.

The InGaN/GaN Thorlabs L520P50 green laser diode exhibits 50 mW optical power at a maximum 160 mA continuous-wave injection current and is mounted on a Thorlabs TCLDM9 diode mount.

The output light beam from the laser facet was collimated by an aspheric lens (Thorlabs, A110TM-A) of a focal length of 6.24 mm and numerical aperture 0.40. A 92:8 pellicle beam splitter (BS, Thorlabs, BP108) was used to split 8% of the light beam into an optical spectrum analyzer (OSA, Yokogawa AQ6373B with 0.02 nm resolution) via a bi-convex lens, L3 (Thorlabs, LB1471-A-ML) of focal length 50 mm for diagnostic purposes. The rest of the 92% collimated laser light beam falls on the polka-dot beam splitter (Edmund Optics) with 70% transmissivity working as a partially reflective mirror (splitting the beam at 0° angle), thus forming an external cavity from the laser facet to the mirror. The beam splitter is mounted on a kinematic mount (Thorlabs, KM100) with two knobs to adjust the feedback angle, and placed on a single-axis translational stage to control the external cavity length, thus providing three degrees of freedom for fine-tuning. 30% of the incoming light beam is fed back into the laser active region by polka-dot beam splitter, while the transmitted 70% is the usable optical power for various multidisciplinary applications.

Figure 7:
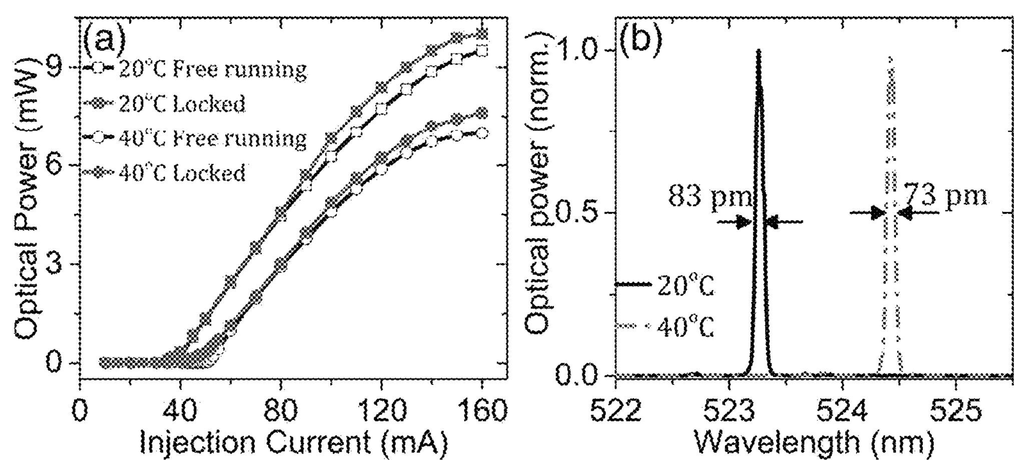
FIG. 7 illustrates (a) L-I characteristics of a self-injection locked tunable laser system at 20° C. and 40° C. and (b) single longitudinal lasing mode operation at 36 and 47 mA (° C.) injection currents at 20° C. and 40° C. respectively.

Two external cavity lengths were used in this example, 28 cm and 12 cm. The reduction in threshold current of the laser diode is a key advantage of efficient self-injection locking, SIL, yielding a significant improvement in the laser optical power at a fixed injection current above the threshold, shown in and is evident from the L-I characteristics curve in FIG. 7(*a*). The threshold current is found to reduce from 40 to 34 mA at 20° C. and 52 to 44 mA at 40° C. heat sink temperature. This is attributed to the lower gain threshold in an ECDL system compared to the free-running laser counterpart. Moreover, the slope efficiency increased from 0.09 (0.075) to 0.11 (0.083) W/A at 20 (40°) C., thus improving the optical power, in general, by >0.6 mW at higher injections, under self-injection locking, SIL. The near single longitudinal mode, SLM, operation of the tunable laser system at 20 and 40° C. at sub-threshold (defined as current values below the free-running and above the self-injection locked threshold currents) injection currents is presented in FIG. 7(*b*). The spectral linewidths of 83 and 73 pm are measured at 36 (20° C. and 47 mA (40° C.) injection currents, respectively, at 28 cm external cavity length.

The present disclosure shows the extended tunability of 4.16 nm (521.10-525.26 nm) at 36 mA injection current compared to 2.84 nm (525.07-527.91 nm) at 160 mA, at 20° C. room temperature, along with redshifting of the modes (emission spectra) in the latter case, an effect of bandgap shrinkage due to junction heating at high injection current as shown in FIG. 3, 4. As a result of less mode competition in the lasing spectrum at lower injection current compared to higher injection current, a wider tuning window is exhibited. The tunability was accomplished by the careful control of the external cavity length and feedback angle to achieve a round-trip phase match of any particular longitudinal mode, whose wavelength (frequency) resonates within the composite cavity (i.e., laser and external cavity). This ensures self-injection locking of that particular mode, and all the power from the neighboring side modes consolidate to increase this dominant mode power while suppressing the side modes, thus significantly improving the side mode suppression ratio, SMSR. Although tunability was found to be possible at all injection currents discretely, the values of low (36 mA) and high (160 mA) current which collectively cover the entire demonstrated tuning window were selected for this example. Moreover, a SMSR threshold of 10 dB was selected for the system performance investigation. The wavelength tunability was found to be considerably larger than those of the prior art at a threshold SMSR of 6 dB.

Figure 8:
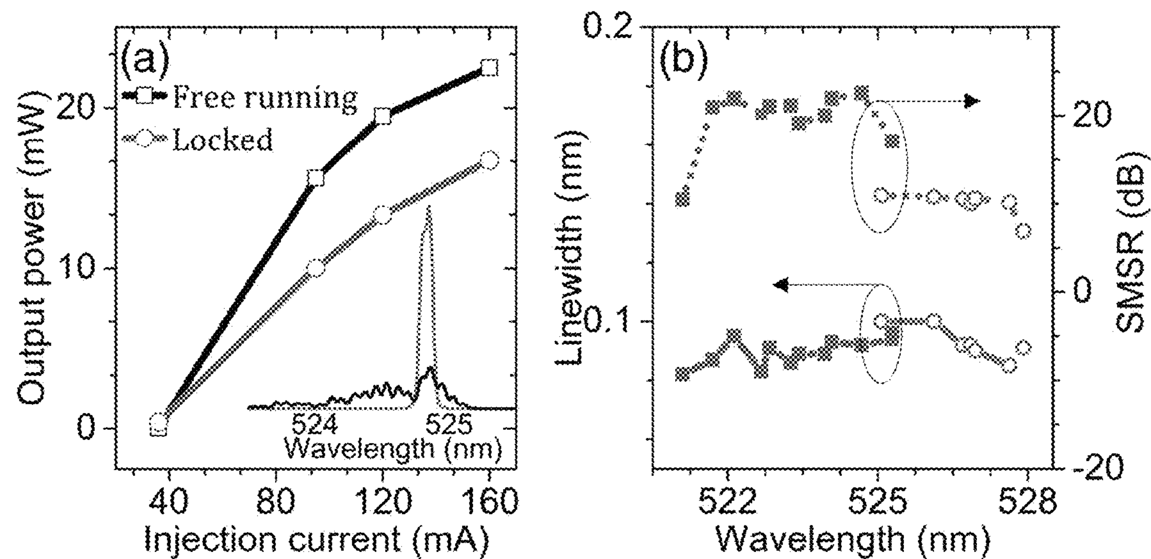
FIG. 8 illustrates (a) the comparison of the output optical power under freerunning and self-injection locked cases with an inset showing the freerunning and locked modes at 160 mA and (b) the measured spectral linewidth and SMSR of the tunable locked modes along the tunable wavelengths at 36 mA (square symbols) and 160 mA (circle symbols) injection currents, where the external cavity is fixed at 28 cm and temperature at 20° C.

The measured optical power of the system, from a tunable locked mode, is compared with the free-running case in FIG. 8(*a*) at different injection currents. At low current injection, a power extraction efficiency of 65%-70% is noted, with a maximum value of 74% at 160 mA, corresponding to an optical power of ~16.7 mW with a 524.85 nm locked mode. In the SIL-based tunable laser system there is no trade-off between the tunability and power efficiency, which is very common in the Littrow configuration, thus the system achieves a high efficiency at high injection currents as well. The measured spectral linewidth and SMSR of various locked modes across the tuning window are plotted in FIG. 8(*b*) at both low and high injection currents.

At 36 mA (i.e., across a 4.16 nm tuning window), all the locked modes showed a ≥20 dB SMSR, which is more than twice the value compared to 160 mA (i.e., >10 dB) while, across the collective tuning window of 6.81 nm, the spectral linewidth of the modes is found to be ≤100 pm. Lastly, it was found that SMSR values corresponding to the extreme locked mode wavelengths at both currents are found to decrease. This indicates operation at the extreme of the active region gain profile.

Figure 9:
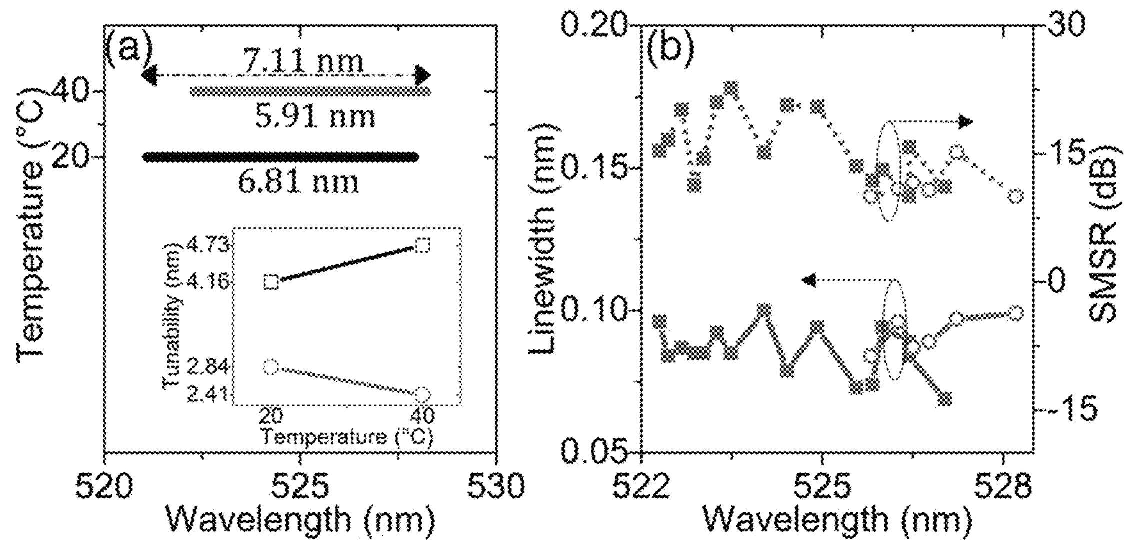
FIG. 9 illustrates (a) the collective tuning range of the system at low injection, 36 mA for 0° C. and 47 mA for 40° C., and high injection, 160 mA at 20° C. and 40° C. The inset shows the individual contribution of low (square symbols) and high (circle symbols) injection current towards the achieved tenability and (b) the measured spectral linewidth and SMSR across the collective tuning span of 5.91 nm for low (square symbols) and high (circle symbols) injection currents at 40° C., where the external cavity is fixed at 28 cm.

The effect of temperature was determined in two different instances at 20° C. room temperature and 40° C., and the results are plotted in FIG. 9. A tunability spanning from 521.10 to 527.91 nm, covering 6.81 nm was measured at 20° C. whereas, at 40° C., the range of tunability was from 522.3 to 528.21 nm, which covers 5.91 nm, as depicted in FIG. 9(*a*). This redshift in the tuning window was attributed to the temperature-dependent bandgap shrinkage, thereby causing redshift of the active-region gain profile. It was noticed that increasing the temperature reduces the total tuning range; however, a closer look at individual injection currents contribution towards the tunability, as illustrated in the inset of FIG. 9(*a*), shows that lower and higher injection currents behave reciprocally. Upon increasing the temperature from 20° C. to 40° C., a lower injection current (36 mA at 20° C. and 47 mA at 40° C.) demonstrates a higher tuning range from 4.16 to 4.73 nm. In contrast, a high injection current of 160 mA experiences a reduction in the tuning range from 2.84 to 2.41 nm when increasing the temperature. This is ascribed to the wider gain profile access at the higher temperature with smaller lasing mode competition at a low injection current, thus extending the tuning range. On the other hand, at high injection currents, the mode competition was shown to intensify and dominate at the high temperature, which resulted in the narrowing of the tuning window.

FIG. 9(*b*) summarizes the results of the spectral linewidth and SMSR across the tuning range of 5.91 nm at 40° C. at both injection currents. A very consistent locked mode linewidth, staying below 100 pm, was measured throughout the tuning window, with the smallest value of 69 pm at a 47 mA injection current. The inclusion of an additional partial mirror-based cavity, within an external cavity (two-stage self-injection locked laser), would reduce the mode linewidths further. On the other hand, an SMSR at a low (high) injection current was observed in the range of 22.7-10.1 (15.2-10.0) dB. This fluctuation across the various locked modes may be due to active-region gain profile alteration as a result of optical feedback, which could be profound at high temperature. In conclusion, an aggregate tunability of 7.11 nm was measured for this example as a function of injection current and temperature, with a >10 dB SMSR and <100 pm spectral linewidth.

To understand the effect of the cavity length on the tuning range of the SIL-based tunable laser system, the effect of low (36 mA) and high (160 mA) injection currents on a reduced 12 cm external cavity and at 20° C. room temperature was determined. From FIG. 10(*a*), it can be observed that a collective tunable span of the SIL laser diode reduced from 6.81 to 5.55 nm after reducing the external cavity from 28 to 12 cm, respectively.

Figure 10:
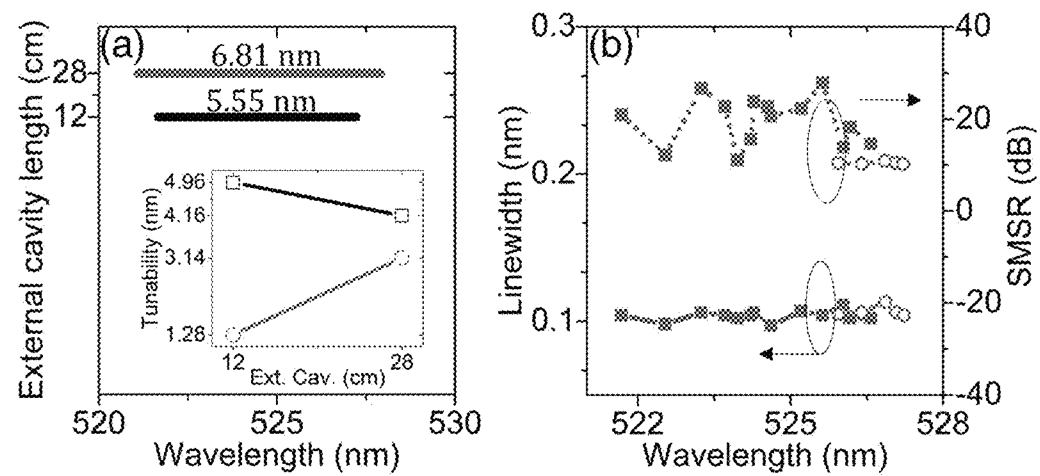
FIG. 10 illustrates (a) the collective tuning range of the system at low injection, 36 mA, and high injection, 160 mA, at two different external cavity lengths, and at 20° C. The inset shows the individual contributions of low (square symbols) and high (circle symbols) injection currents towards the achieved tunability. (b) Measured spectral linewidth and SMSR across the collective tuning span of 5.55 nm for low (square symbols) and high (circle symbols) injection currents at 12 cm external cavity.

Moreover, as depicted in the inset of FIG. 10(*a*), the tunability at a 36 mA injection current was found to increase from 4.16 to 4.96 nm, while reducing from 3.14 to 1.28 nm at 160 mA upon reducing the external cavity length from 28 to 12 cm.

The performance of the reduced external cavity tunable system was determined by examining the measured spectral linewidth and SMSR across the tuning window of 5.55 nm. Referring again to FIG. 10(*b*), at a low injection current, the SMSR is found to vary in the range of 27.8 to 10.2 dB, with the former value being the best result achieved.

At high injection current, the SMSR displayed a steady average value of ~10.5 dB across the tuning range. This observation illustrates that the SILwas sensitive at a low injection current as compared to a high injection current, attributed to reduced optical feedback and operation in the sub-threshold current region. Nonetheless, the observed linewidth of the tunable SIL modes across the tuning wavelengths stayed close to 100 pm at both injection currents.

Figure 11:
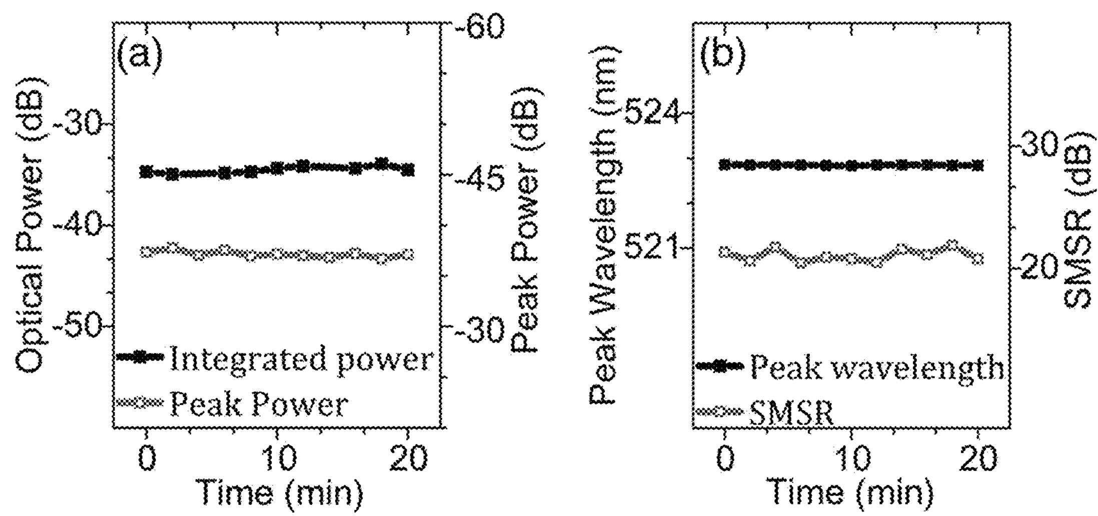
FIG. 11 illustrates the short-term stability of the self-injection locked tunable laser system showing the stability of (a) the total integrated and peak optical power and (b) the peak wavelength and SMSR of a 522.86 nm locked mode, at 36 mA injection current, 20° C. temperature, and 28 cm external cavity.

A short-term stability test was performed on a tunable 522.86 nm locked mode at an injection current of 36 mA and 20° C. for 20 min. The results are plotted in FIG. 11 at 2 min intervals. The total integrated and peak optical powers were very stable throughout the time span, as can be observed from FIG. 10(*a*), with a mere variation of ~1 dB across the entire 20 min of the experiment. As shown in FIG. 10(*b*), which represents the fluctuation of the corresponding mode SMSR and peak wavelength over time, the power was found to be teady at ~20 dB (~1 dB variation) and within a range of 522.84-522.86 (~20 pm variation), respectively. Thus, superior performance was exhibited by the SIL-based tunable system.

In summary, a self-injection locked-based 7.11 nm tunable laser system was demonstrated using a green InGaN/GaN laser diode. A near SLM tenability was observed over the entire tuning range with SMSR and spectral linewidth reaching values of 28 dB and 69 pm, respectively. The tunable laser system exhibited 74% power efficiency with a measured tunable locked mode optical power of 16.7 mW.

Next, a hardware description of the controllers according to exemplary embodiments is described with reference to FIG. 6. In FIG. 6, the controller described is a computing device which includes a CPU 600 which performs the processes described above/below. The process data and instructions may be stored in memory 602. These processes and instructions may also be stored on a storage medium disk 604 such as a hard drive (HDD) or portable storage medium or may be stored remotely.

Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claimed advancements may be provided as a utility application, background daemon, or component of an operating system, or combination thereof, executing in conjunction with CPU 600 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 600 may be a Xenon or Core processor from Intel of America or an Opteron processor from AMD of America, or may be other processor types that would be recognized by one of ordinary skill in the art. Alternatively, the CPU 600 may be implemented on an FPGA, ASIC, PLD or using discrete logic circuits, as one of ordinary skill in the art would recognize. Further, CPU 600 may be implemented as multiple processors cooperatively working in parallel to perform the instructions of the inventive processes described above.

The computing device in FIG. 6 also includes a network controller 606, such as an Intel Ethernet PRO network interface card from Intel Corporation of America, for interfacing with network 66. As can be appreciated, the network 66 can be a public network, such as the Internet, or a private network such as an LAN or WAN network, or any combination thereof and can also include PSTN or ISDN subnetworks. The network 66 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 608, such as a NVIDIA GeForce GT6 or Quadro graphics adaptor from NVIDIA Corporation of America for interfacing with display 610, such as a Hewlett Packard HPL2445w LCD monitor. A general purpose I/O interface 612 interfaces with a keyboard and/or mouse 614 as well as a touch screen panel 616 on or separate from display 610. General purpose I/O interface also connects to a variety of peripherals 618 including printers and scanners, such as an OfficeJet or DeskJet from Hewlett Packard. The I/O interface 612 is also connected to Piezo Linear Stage Control 621 and to Current Source and Voltage Control 601, which control the linear translational stage 110 and the tilting mount 108 respectively.

A sound controller 620 is also provided in the computing device such as Sound Blaster 6-Fi Titanium from Creative, to interface with speakers/microphone 622 thereby providing sounds and/or music.

The general purpose storage controller 624 connects the storage medium disk 604 with communication bus 626, which may be an ISA, EISA, VESA, PCI, or similar, for interconnecting all of the components of the computing device. A description of the general features and functionality of the display 610, keyboard and/or mouse 614, as well as the display controller 608, storage controller 624, network controller 606, sound controller 620, and general purpose I/O interface 612 is omitted herein for brevity as these features are known.

Obviously, numerous modifications and variations of the present invention are possible in light of the above teachings. It is therefore to be understood that within the scope of the appended claims, the invention may be practiced otherwise than as specifically described herein.

The invention claimed is:

1. A self-injection locked tunable laser system, comprising:

a GaN/InGaN laser diode located on an optical axis, the GaN/InGaN laser diode having an internal cavity formed by a partially reflective first surface and a second partially reflective opposing surface, the internal cavity further including a laser gain medium;

a first collimating lens on the optical axis and proximate the first surface;

a first partially reflecting mirror on the optical axis;

a first motorized translational stage located at a distance, d, from the first surface;

a first tilting mount located on the first motorized translational stage and configured to support the first partially reflecting mirror, wherein the first tilting mount further includes first adjusters to tilt the first partially reflecting mirror;

first circuitry configured to inject current into the GaN/InGaN laser diode, wherein injecting current into the GaN/InGaN laser diode causes light to resonate at a first frequency within the internal cavity and to emit a laser beam from the first surface, the laser beam having a plurality of modes;

second circuitry configured to power the first motorized translational stage to move along the distance, d;

wherein the GaN/InGaN laser diode, the first collimating lens and the first partially reflecting mirror are coaxially located with respect to the optical axis;

wherein the first partially reflecting mirror, the first collimating lens and the first surface form a first external laser cavity, the first partially reflecting mirror reflecting a first portion of the laser beam towards the front surface;

wherein the first external cavity does not include a wavelength selective tuning element;

wherein the first motorized translational stage is powered by the second circuitry to move the first mirror along the optical axis to change the length of the first external laser cavity;

wherein the first tilting mirror is configured to change the angle of reflection of a portion of the laser beam;

wherein a second portion of the laser beam passes through the first tilting mirror as a first output laser beam;

wherein the system is configured such that adjusting the distance, d, and the angle of reflection of the first portion of the laser beam causes the first portion of the laser beam to enter the front surface and tune the mode of the resonant frequency of the laser beam in the internal cavity, and wherein a self-injection ratio is defined as the ratio of the power of the laser beam from the first external cavity entering the front surface of the laser diode to the power of the laser beam exiting the front surface of the laser diode from the internal cavity, and the self-injection ratio is in the range of −12 dB to −1 dB.

2. The self-injection locked tunable laser system of claim 1, wherein the laser beam in the first external cavity resonates at a second frequency within the first external cavity based on the distance, d;

wherein changing the distance, d, tunes the second resonance frequency to match the first resonance frequency, causing the laser beam to self-injection lock to a particular wavelength mode.

3. The self-injection locked tunable laser system of claim 1, wherein the collimating lens is an aspheric lens of short focal length, in the range of 6 to 10 mm.

4. The self-injection locked tunable laser system of claim 2, wherein the system is configured such that self-injection locking to a particular mode substantially increases a peak power and a total power of the particular mode as compared to the other modes.

5. The self-injection locked tunable laser system of claim 1, wherein the GaN/InGaN laser diode operates at a temperature in the range of 0° C. to 50° C. and an injection current in the range of 35 mA to 160 mA.

6. The self-injection locked tunable laser system of claim 5, wherein the GaN/InGaN laser diode has a threshold injection current for producing a laser beam, wherein the threshold injection current of the GaN/InGaN laser diode with self-injection locking is less than the threshold current of the GaN/InGaN laser diode without self-injection locking at a particular temperature.

7. The self-injection locked tunable laser system of claim 6, wherein the self-injection mode determines a laser wavelength having linewidth of 60 μm to 100 μm, for all operating injection currents in the range of 35 mA to 160 mA and temperatures in the range of 0° C. to 50° C.

8. The self-injection locked tunable laser system of claim 1, further comprising a second partially reflecting mirror on the optical axis and coaxial with the first partially reflecting mirror, such that a second external cavity is formed between the first partially reflecting mirror and the second partially reflecting mirror;

a second motorized translational stage located a distance, k, from the first partially reflecting mirror;

a second tilting mount located on the second motorized translational stage and configured to support the second partially reflecting mirror, wherein the second tilting mount further includes second adjusters to tilt the partially reflecting mirror;

fourth circuitry configured to power the second motorized translational stage to move along the distance, k;

wherein the second portion of the laser beam output from the first external cavity is reflected from the second partially reflecting mirror and resonates in the second external cavity at a third frequency based on the distance, k;

powering the second motorized translational stage to change the distance, k;

adjusting the second adjusters to adjust the angle of reflection of the laser beam in the second cavity to tune the mode of the resonance frequency of the laser beam in the second cavity to equal the mode of the resonance frequency of the laser beam in the first cavity, thus self-injection locking the laser beam in the second cavity to the laser beam in the first cavity.

9. The self-injection locked tunable laser system of claim 8, wherein the self-injection wavelength mode has a linewidth of less than 60 μm for all operating injection currents in the range of 35 mA to 160 mA and temperatures in the range of 0° C. to 50° C.

10. The self-injection locked tunable laser system of claim 9, wherein the first resonance frequency in the internal cavity is further configured to be tuned by adjusting the injection current and/or the temperature.

11. A method for self-injection locking a tunable laser, comprising:

arranging a GaN/InGaN laser diode, first collimating lens and first partially reflecting mirror coaxially with respect to an optical axis, wherein the GaN/InGaN laser diode has an internal cavity and a first facet, and wherein the distance, d, between the front facet of the laser diode and the mirror defines a first external cavity;

arranging between the first partially reflecting mirror and the front facet a first motorized translational stage having a first tilting mount for holding the first partially reflecting mirror, arranging a second partially reflecting mirror on the optical axis and coaxial with the first partially reflecting mirror, such that a second external cavity is formed between the first partially reflecting mirror and the second partially reflecting mirror;

arranging a second collimating lens in the second external cavity coaxial with the first partially reflecting mirror and the second partially reflecting mirror;

arranging a second motorized translational stage at a distance, k, from the first partially reflecting mirror;

installing a second tilting mount on the second motorized translational stage and installing the second partially reflecting mirror on the second tilting mount, the second tilting mount further including second adjusters for tilting the partially reflecting mirror;

injecting, by a current source, current into the GaN/InGaN laser diode, wherein when the current is greater than a lasing threshold current of the GaN/InGaN laser diode, until the laser beam resonates at a first resonance frequency within the internal cavity, causing the laser diode to emit a laser beam through the front facet;

collimating, by the first collimating lens, the laser beam emitted from the front facet;

reflecting, by the first partially reflecting mirror, a first portion of the laser beam back towards the front facet;

adjusting the distance between the first partially reflecting mirror and the front facet by the first motorized translational stage having the first tilting mount for holding the first partially reflecting mirror, adjusting, by first adjusters on the first tilting mount, the angle of reflection of the first partially reflecting mirror, wherein adjusting the distance, d, and the angle of reflection of the first portion of the laser beam causes the first portion of the reflected laser beam to reenter the front facet and tune the first resonant frequency of the laser beam in the internal cavity to self-injection lock the first resonance frequency;

transmitting, by the first partially reflecting mirror, a second portion of the laser beam as an output laser beam, arranging a second partially reflecting mirror on the optical axis and coaxial with the first partially reflecting mirror, such that a second external cavity is formed between the first partially reflecting mirror and the second partially reflecting mirror;

powering, by fourth circuitry, the second motorized translational stage to move along the distance, k;

reflecting, from the second partially reflecting mirror, the laser beam output from the first external cavity;

powering the second motorized translational stage to change the distance, k, until the laser beam resonates in the second external cavity at a third frequency;

adjusting the second adjusters to adjust the angle of reflection of the laser beam in the second cavity to tune the third resonance frequency to equal the frequency of the laser beam in the first external cavity, thus self-injection locking the mode of the laser beam in the second external cavity to the mode of the laser beam in the external first cavity.

12. The method for self-injection locking the tunable laser of claim 11, emitting, from the front facet, a laser beam having a plurality of modes of the first resonance frequency;

adjusting the distance between the first partially reflecting mirror and the front facet until the laser beam resonates within the first external cavity at a second resonance frequency equal to the first resonance frequency to self-injection lock to a single mode of the plurality of modes.

13. The method for self-injection locking the tunable laser of claim 11, further comprising operating the GaN/InGaN laser diode at a temperature in the range of 0° C. to 50° C. and an injection current in the range of 35 mA to 160 mA.

14. The method for self-injection locking the tunable laser of claim 12, further comprising tuning the first resonance frequency in the internal cavity by adjusting the injection current and/or the temperature.

* * * * *